(12) United States Patent
Chen et al.

(10) Patent No.: US 7,064,952 B1
(45) Date of Patent: Jun. 20, 2006

(54) DISPLAY DEVICE WITH DETACHABLE HEAT-SINK STRUCTURE THEREOF

(75) Inventors: Sheng-Hsin Chen, Nantou (TW); Tsao-Yuan Fu, Taoyuan Hsien (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 0 days.

(21) Appl. No.: 10/906,042

(22) Filed: Feb. 1, 2005

(51) Int. Cl.
*H05K 7/20* (2006.01)
*G02F 1/1333* (2006.01)

(52) U.S. Cl. .................. 361/681; 361/704; 361/719; 349/58; 349/60

(58) Field of Classification Search .......... 361/681, 361/704, 719; 349/58, 60
See application file for complete search history.

(56) References Cited

U.S. PATENT DOCUMENTS

| | | | |
|---|---|---|---|
| 5,808,707 A * | 9/1998 | Niibori et al. ............... 349/60 |
| 6,411,353 B1 * | 6/2002 | Yarita et al. ................. 349/59 |
| 6,545,733 B1 * | 4/2003 | Kaga et al. .................. 349/58 |
| 6,693,682 B1 * | 2/2004 | Fujishiro et al. ............. 349/65 |
| 6,816,213 B1 * | 11/2004 | Kato et al. ................... 349/58 |
| 6,825,894 B1 * | 11/2004 | Aoyagi et al. ............... 349/61 |
| 6,862,053 B1 * | 3/2005 | Lee et al. .................... 349/58 |

* cited by examiner

*Primary Examiner*—Boris Chervinsky
(74) *Attorney, Agent, or Firm*—Jiang Chyun IP Office

(57) ABSTRACT

A display device comprises a display panel, a back plate, a fixing plate, a flexible printed circuit board and a driving chip. The display panel has a peripheral circuit area. The back plate is fixed on the display panel such that the peripheral circuit area remains exposed. The fixing plate is detachably installed on the back plate, and the flexible printed circuit board is disposed on the fixing plate, wherein the flexible printed circuit board is electrically connected with the peripheral circuit area. The driving chip is electrically connected with the flexible printed circuit board. Compared with the back plate, the driving chip is disposed adjacent to the peripheral circuit area. Because the peripheral circuit area of the display panel is exposed, the flexible printed circuit board can be directly reworked to shorten its rework time on the premise of no separation between the display panel and the back plate.

13 Claims, 2 Drawing Sheets

DISPLAY DEVICE WITH DETACHABLE HEAT-SINK STRUCTURE THEREOF

BACKGROUND OF THE INVENTION

1. Field of the Invention

The present invention relates to a display device. More particularly, the present invention relates to a display device capable of reducing time of replacing the flexible printed circuit board (FPC) during rework of the display device.

2. Description of Related Art

Generally, the display device can be broadly classified into two types, namely cathode ray tube (CRT) display device and flat panel display device. As for the flat panel display device type, it can be further classified into several types such as liquid crystal display (LCD), plasma display panel (PDP), field emission display (FED) and the like.

The working principle of plasma display panel (PDP) can be described as follows. A PDP typically comprises two glass substrates a plurality of electrodes and noble gas, for example, Ne, Xe, He, Xe etc. The electrodes are disposed on these two glass substrates respectively to form a plurality of discharge cells. The noble gas filled between within the discharge cell is excited under high-voltage electric field and emits ultraviolet (UV) light, and the emitted UV light impinges onto a phosphor layer of discharge cells whereby a plurality of visible lights, such as red, green, and blue lights, are emitted from the phosphor layer. Thus, a color image comprising a mixture of three fundamental colors (red, green and blue) of the visible lights via drive circuit can be displayed. Because of the advantages of larger display size, wide-view angle, thinner, lighter and no ionizing radiation, the plasma display has become the mainstream of flat panel display and could gradually replace the conventional CRT display in the near future.

FIG. 1 is a schematic view of a conventional plasma display device. Referring to FIG. 1, the conventional display device 100 comprises a display panel 110, a back plate 120, a flexible printed circuit (FPC) board 140, a driving chip 150, a printed circuit board (PCB) 160 and a heat-sink member 170, wherein the display panel 110 has a peripheral circuit area 112, and the back plate 120 is fixed on the display panel 110. It should be noted that the dimension of the back plate 120 is designed to be larger than or equal to that of the display panel 110, and then the display device 100 can be assembled onto the housing of the final display product. Moreover, cement 130 is often used for tightly sticking the back plate 120 onto the display panel 110.

One end of the flexible printed circuit board 140 is electrically connected to the peripheral circuit area 112 of the display panel 110, and another end of the flexible printed circuit board 140 is electrically connected to the printed circuit board (PCB) 160. In addition, the display device 100 can be driven by the driving chip 150 which is electrically connected to the flexible printed circuit board 140 and the peripheral circuit area 112 of the display panel 110. The heat-sink member 170 is installed on the driving chip 150 for conducting the heat away from the driving chip 150, wherein the heat-sink member 170 is fixed on the back plate 120 using screws 180.

Noticeably, the electrical connection between the flexible printed circuit board 140 and the peripheral circuit area 112 of the display panel 110 is secured by sticking the flexible printed circuit board 140 onto the display panel 110 using thermal compression technique. However, in an abnormal conditions, such as presence of undesired objects in the electrodes of the peripheral circuit area 112 of the display panel 110 or the poor quality of the flexible printed circuit board 140, the flexible printed circuit board 140 may get damaged during the thermal compression process for electrically connecting the flexible printed circuit board 140 and the peripheral circuit area 112 of the of the display panel 110 and as a result the flexible printed circuit board 140 may malfunction and may even result in breakdown of display device 100.

However, despite breakdown of display device 100 is induced by the malfunction of the flexible printed circuit board 140, the display panel 110 may be in good condition and function well. Therefore, it would desirable to repair display device 100 in order to utilize the display panel 110. One remedy of repairing the breakdown of display device 100 could be replacing the flexible printed circuit board 140. The rework of the display device 100 for replacing the flexible printed circuit board 140 is described as follows. Because the dimension of the back plate 120 is equal or larger than that of the display panel 110, the peripheral circuit area 112 of the display panel 110 is usually covered by the back plate 120, therefore, the back plate 120 must be separated from the display panel 110 for implementing rework of the display device 100. First, the heat-sink member 170, the driving chip 150 and the flexible printed circuit board 140 are detached and separated. Next, the cement 130 is cut to separate the back plate 120 from the display panel 110, and then the residual cement 130 on the display panel 110 is removed by using a chemical agent. Next, the flexible printed circuit board 140 is replaced with a new flexible printed circuit board 140, which is then electrically connected to the peripheral circuit area 112 of the display panel 110 by utilizing thermal compression process. Thereafter, the back plate 120 is fixed onto the display panel 110 via the cement 130. Accordingly, the rework of the display device 100 (i.e. changing the flexible printed circuit board 140) is complicated, incur wastage of the materials (i.e. cement, the chemical agent and etc), involve heavy labor work and consume substantial amount of time. Therefore, the rework cost of the display device 100 is significant.

SUMMARY OF THE INVENTION

Accordingly, the present invention is directed to a display device capable of reducing rework time of the display device and allows use of a flexible printed circuit board with a comparatively shorter length for electrically connecting the display panel and the driving chip.

The present invention is also directed to a detachable heat-sink structure suitable for a display device for implementing easy and efficient replacement or maintenance of the flexible printed circuit board by detaching the detachable heat-sink structure and the fixing plate.

According to an embodiment of the present invention, a display device is disclosed. The display device comprises a display panel, a back plate, a fixing plate, a flexible printed circuit board and a driving chip. Wherein, the display panel has a peripheral circuit area. The back plate is fixed on the display panel and the peripheral circuit area is extended outside the back plate. The fixing plate is detachably installed onto the back plate. The flexible printed circuit board is disposed on the fixing plate and is electrically connected to the peripheral circuit area of the display panel. The driving chip is electrically connected to the flexible printed circuit board, wherein the driving chip is positioned closer to the peripheral circuit area of the display panel compared to the back plate.

According to an embodiment of the present invention, a cement is utilized for tightly fixing the display panel and the back plate. In addition, in one embodiment, the display device further comprises a printed circuit board disposed on the fixing plate, wherein the printed circuit board is electrically connected to the driving chip via the flexible printed circuit board. Furthermore, in one embodiment, the display device further comprises a heat-sink member installed on the fixing plate.

According to an embodiment of the present invention, the display device further comprises a thermally conductive paste disposed between the driving chip and the heat-sink member and between the flexible printed circuit board and the fixing plate. Additionally, in one embodiment, the heat-sink member is positioned on the fixing plate using one or more positioning elements, and the fixing plate is positioned on the back plate using one or more positioning elements, and wherein the positioning elements comprise screws or rivets.

According to an embodiment of the present invention, the material of the back plate comprises aluminum or aluminum alloy, and the driving chip comprises a chip of flip-chip type and is disposed on the flexible printed circuit board.

According to an embodiment of the present invention, the detachable heat-sink structure is suitable for a display device comprising a display panel, a back plate, a flexible printed circuit board and a driving chip. The display panel has a peripheral circuit area. The back plate is fixed on the display panel and the peripheral circuit area is extended outside the back plate. The flexible printed circuit board is electrically connected to the peripheral circuit area of the display panel. The driving chip is electrically connected to the flexible printed circuit board. The driving chip is disposed closer to the peripheral circuit area of the display panel compared to the back plate. The detachable heat-sink structure comprises a fixing plate and a heat-sink member, wherein the fixing plate is detachably disposed on the back plate, and the heat-sink member is detachably disposed on the fixing plate.

According to an embodiment of the present invention, the detachable heat-sink structure further comprises a cement disposed between the display panel and the back plate. In addition, in one embodiment, the display device further comprises a thermally conductive paste disposed between the driving chip and the heat-sink member and between the flexible printed circuit board and the fixing plate.

According to an embodiment of the present invention, the heat-sink member is positioned on the fixing plate using one or more positioning elements, and the fixing plate is positioned on the back plate using one or more positioning elements, wherein the positioning elements comprise screws or rivets.

According to an embodiment of the present invention, because the heat-sink member and the fixing plate of the display panel are being detachably disposed, therefore the heat-sink member, the printed circuit board and the fixing plate can be easily detached for implementing rework or replacement of flexible printed circuit board in an abnormal event such as presence of undesirable objects in the electrodes of the peripheral circuit area 112 of the display panel 110 or the poor quality of the flexible printed circuit board 140. Particularly, because the peripheral circuit area of the display panel is remain exposed (that is, the peripheral circuit area of the display panel is not covered by the back plate), the rework of the flexible printed circuit board can be implemented without disassembling or separating the display panel and the back plate. Hence, the rework time of the flexible printed circuit board can be significantly reduced.

DESCRIPTION OF THE EMBODIMENTS

Various specific embodiments of the present invention are disclosed below, illustrating examples of various possible implementations of the concepts of the present invention. The following description is made for the purpose of illustrating the general principles of the invention and should not be taken in a limiting sense. The scope of the invention is best determined by reference to the appended claims.

Figure 1:
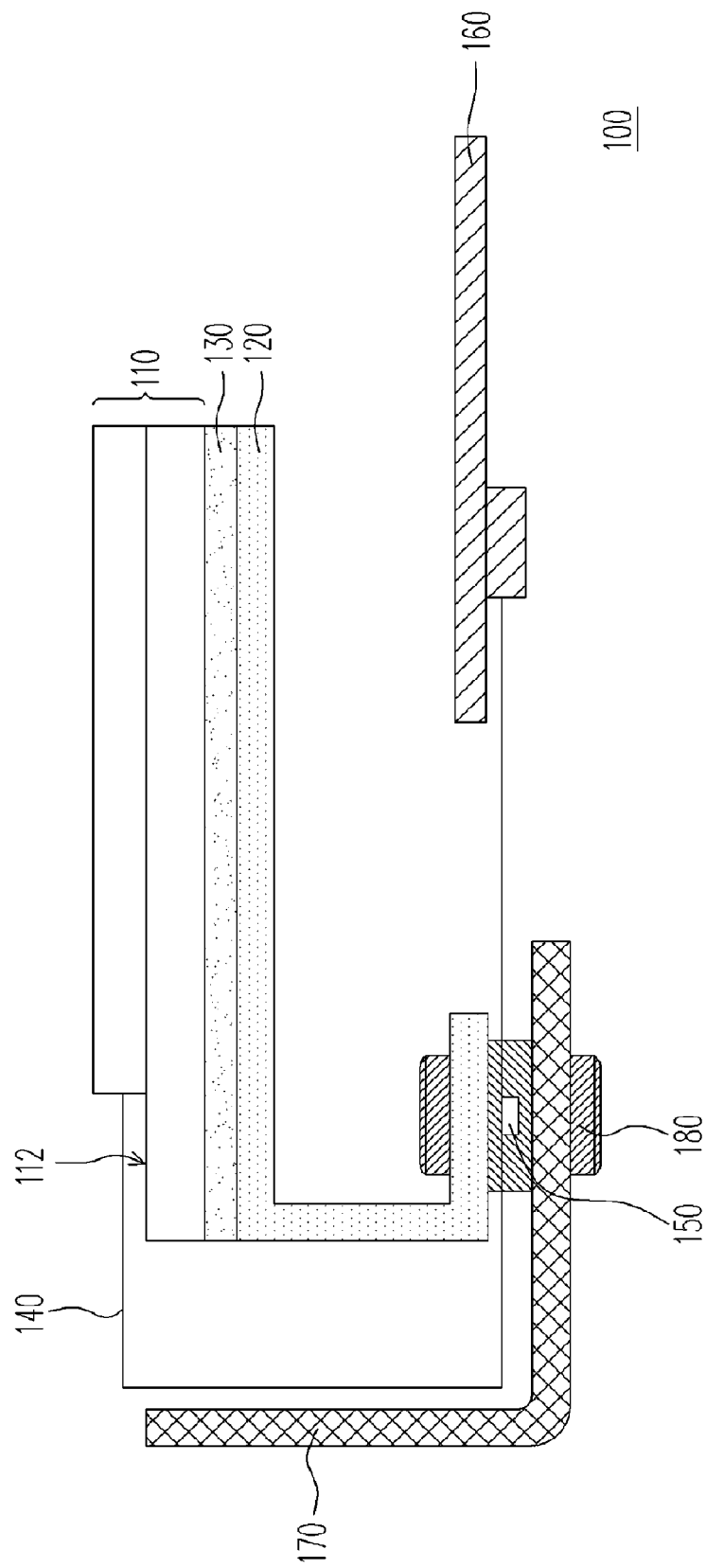
FIG. 1 is a schematic view of a conventional display device.
Figure 2:
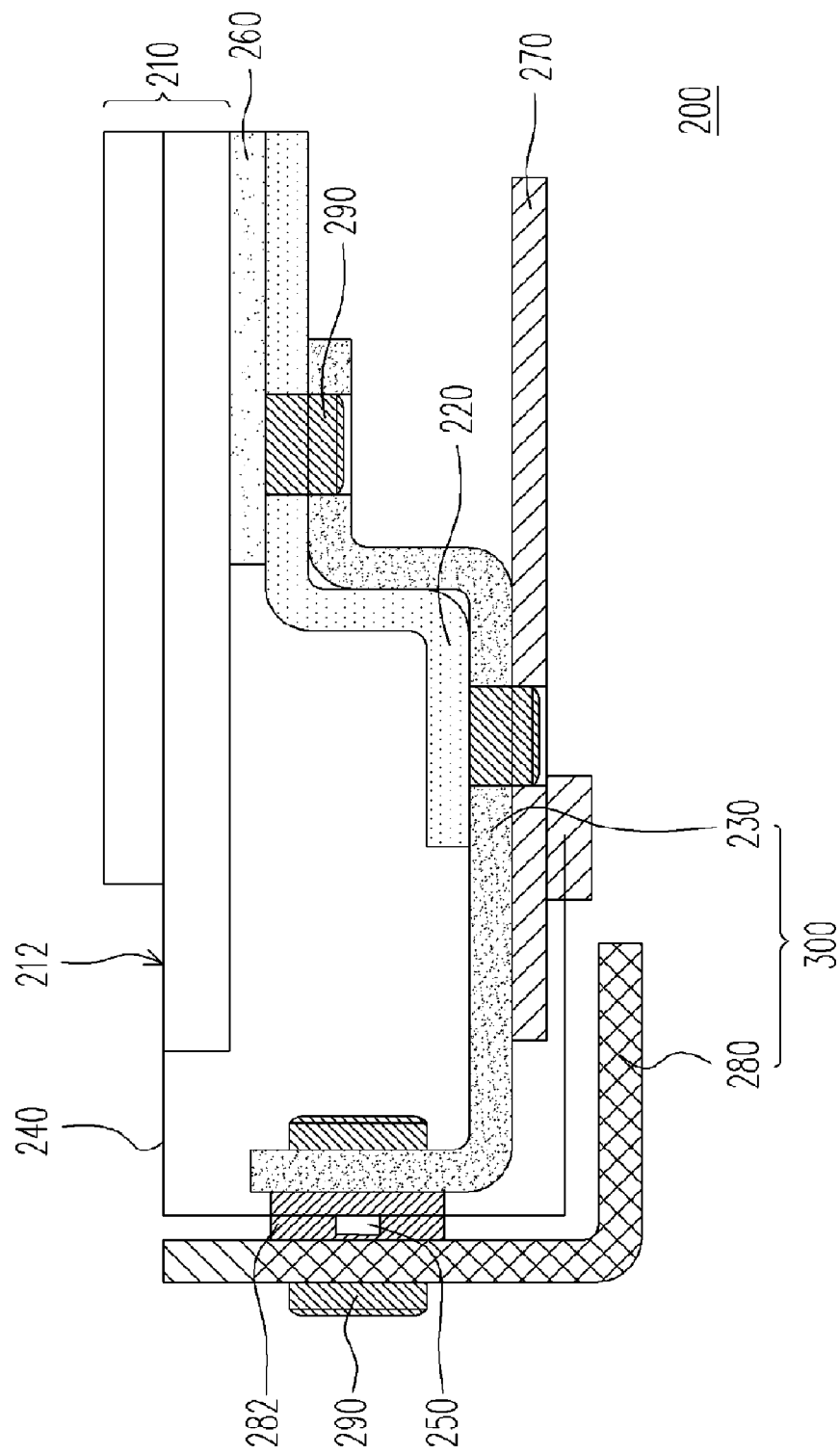
FIG. 2 is a schematic view of a display device according to one embodiment of the present invention.

FIG. 2 is a schematic view of a display device according to one embodiment of the present invention. Referring to FIG. 2, the display device 200 is, for example, a plasma display panel (PDP) apparatus. The display device 200 mainly comprises a display panel 210, a back plate 220, a fixing plate 230, a flexible printed circuit board 240 and a driving chip 250. The display panel 210 has a peripheral circuit area 212. The back plate 220 is fixed on the display panel 210 and the peripheral circuit area 212 is extended outside the back plate 220 (i.e. the peripheral circuit area 212 of the display panel 210 is not covered by the back plate 220). A cement 260 may be utilized for tightly fixing the back plate 220 onto the display panel 210. The material of the back plate 220 may be, for example but not limited to, aluminum or aluminum alloy.

In addition, the fixing plate 230 is detachably installed on the back plate 220, and the flexible printed circuit board 240 is disposed on the fixing plate 230, wherein the flexible printed circuit board 240 is electrically connected to the peripheral circuit area 212 of the display panel 210. The driving chip 250 is electrically connected to the flexible printed circuit board 240. It should be noted that longer the length of the flexible printed circuit board 240, the higher is the cost. In one embodiment of the present invention, because the driving chip 250 is disposed closer to the peripheral circuit area 212 of the display panel 210 compared to the back plate 220, the length of the flexible printed circuit board 240 can be shorter for electrically connecting to the driving chip 250 and the peripheral circuit area 212 of the display panel 210. Hence, the cost on flexible printed circuit board 240 can be significantly reduced.

Furthermore, the display device 200 further comprises a printed circuit board 270 installed on the fixing plate 230, wherein the printed circuit board 270 is electrically connected to the driving chip 250 via the flexible printed circuit board 240. In one embodiment, the printed circuit board 270 can be installed adjacent to the position of the driving chip 250 disposed via the fixing plate 230. Similarly, the length of the flexible printed circuit board 240 can be shorter for electrically connecting the printed circuit board 270 and the driving chip 250. Therefore, the material cost due to the utilization of flexible printed circuit board 240 with comparatively shorter length can be also significantly reduced.

Furthermore, the electrical connection between the driving chip 250 and the flexible printed circuit board 240 can be implemented by both flip chip bonding technology as well as the wire bonding technique.

Referring to FIG. 2, while the display panel 210 is lighted up via the driving chip 250, a great deal of heat energy will be generated from the driving chip 250.

Therefore, in order to prevent the driving chip 250 from breaking down due to high temperature, according to one embodiment of the present invention, the display device 200 can further comprise a detachable heat-sink structure 300, a thermally conductive paste 282 and positioning elements 290. The aforementioned fixing plate 230 may be integrally formed with the detachable heat-sink structure 300 comprising the heat-sink member 280, wherein the heat-sink member 280 is detachably positioned on the fixing plate 230 by using the positioning elements 290, i.e. screws or rivets.

The thermally conductive paste 282 is disposed between the driving chip 250 and the heat-sink member 280 and between the flexible printed circuit board 240 and the fixing plate 230. Hence, the heat generated by the driving chip 250 can be conducted away from the driving chip 250 by the heat-sink member 280 disposed thereon and the fixing plate 230 disposed there-under via the thermally conductive paste 282 and thereby effectively dissipate heat from the driving chip 250. In addition, the aforementioned fixing plate 230 can be detachably positioned on the back plate 220 using the positioning elements 290.

In summary, because the heat-sink member 280 and the fixing plate 230 are detachably disposed, the rework or the replacement of the flexible printed circuit board 240 can be easily implemented by detaching the heat-sink member 280, the printed circuit board 270 and the fixing plate 230 from the display panel 210 in the event the flexible printed circuit board 240 abnormally malfunction, for example, presence of undesirable objects in the electrodes of the peripheral circuit area 212 of the display panel 210 or poor quality of the flexible printed circuit board 240. In addition, during the rework of the flexible printed circuit board 240 can be implemented without separation of the display panel 210 and the back plate 220 because the peripheral circuit area 212 of the display panel 210 is extended outside the back plate 220. Compared to the rework of the flexible printed circuit board of the conventional display device, the time consumed for the rework of the display device described above, according to the present invention, is substantially shorter and therefore the cost can be significantly reduced.

Accordingly, the display device comprising the detachable heat-sink structure according to the present invention has at least the following features and advantages.

(1) A flexible printed circuit board with a comparatively shorter length may be utilized for electrically connecting the driving chip and the peripheral circuit area of the display panel and therefore, it is possible to effectively reduce the cost of the flexible printed circuit. According to an embodiment of the present invention, the flexible printed circuit board is installed on the fixing plate and is electrically connected to the peripheral circuit area of the display panel, and the driving chip is disposed proximate to the peripheral circuit area of the display panel compared to the back plate and is electrically connected to the flexible printed circuit board.

(2) Because the heat-sink member and the fixing plate are detachably disposed, the rework or replacement of the flexible printed circuit board can be easily implemented by detaching the heat-sink member, the printed circuit board and the fixing plate from the display panel in an event when the flexible printed circuit board abnormally malfunction. In addition, when the heat-sink member or the fixing plate is damaged under normal operation condition, replacement or maintenance thereof can be easily implemented.

(3) Because the peripheral circuit area of the display panel is extended outside the back plate, the rework or replacement of the flexible printed circuit board can be directly implemented on the premise without separating the display panel and the back plate. Therefore, the complicated steps of replacing or reworking the flexible printed circuit board as in the case of the conventional display device can be effectively avoided, and the rework time, for example, replacement of the flexible printed circuit board can be significantly reduced.

The above description provides a full and complete description of the embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. A display device, comprising:
   a display panel, comprising a peripheral circuit area;
   a back plate, fixed on the display panel such that the peripheral circuit area of the display panel is extended outside the back plate;
   a fixing plate, detachably installed onto the back plate;
   a flexible printed circuit board, disposed on the fixing plate, wherein the flexible printed circuit board is electrically connected to the peripheral circuit area of the display panel; and
   a driving chip, electrically connected to the flexible printed circuit board, wherein the driving chip is positioned proximate to the peripheral circuit area of the display panel compared to the back plate.

2. The display device of claim 1, further comprising a cement disposed between the display panel and the back plate.

3. The display device of claim 1, further comprising a printed circuit board disposed on the fixing plate, wherein the printed circuit board is electrically connected with the driving chip via the flexible printed circuit board.

4. The display device of claim 1, further comprising a heat-sink member detachably installed on the fixing plate.

5. The display device of claim 4, further comprising a thermally conductive paste disposed between the driving chip and the heat-sink member and between the flexible printed circuit board and the fixing plate.

6. The display device of claim 1, further comprising at least a positioning element, wherein the heat-sink member is positioned on the fixing plate using the positioning element, and the fixing plate is positioned on the back plate using the positioning element.

7. The display device of claim 6, wherein the positioning element comprises a screw or rivet.

8. The display device of claim 1, wherein the back plate comprises aluminum or aluminum alloy.

9. The display device of claim 1, wherein the driving chip is a chip of flip-chip type, and the driving chip is disposed on the flexible printed circuit board.

10. A detachable heat-sink structure suitable for a display device comprising a display panel having a peripheral circuit area, a back plate fixed on the display panel such that the peripheral circuit area is extended outside the back plate, a flexible printed circuit board electrically connected to the peripheral circuit area of the display panel, and a driving chip disposed adjacent to the peripheral circuit area of the display panel, the detachable heat-sink structure comprising:
   a fixing plate, detachably disposed on the back plate; and a heat-sink member, detachably disposed on the fixing plate.

11. The detachable heat-sink structure of claim 10, wherein a thermally conductive paste is disposed between the driving chip and the heat-sink member and between the flexible printed circuit board and the fixing plate.

12. The detachable heat-sink structure of claim 10, further comprising at least a positioning element, wherein the heat-sink member is positioned on the fixing plate using the positioning element, and the fixing plate is positioned on the back plate using the positioning element.

13. The detachable heat-sink structure of claim 12, wherein the positioning element comprises a screw or rivet.

* * * * *